(12) United States Patent
Vetter (10) Patent No.: US 9,641,131 B2
(45) Date of Patent: May 2, 2017

(54) ADAPTIVE SUPPLY VOLTAGE FOR A POWER AMPLIFIER

(75) Inventor: Udo-Michael Vetter, Böhmenkirch (DE)

(73) Assignee: Andrew Wireless Systems GmbH, Buchdorf (DE)

(*) Notice: Subject to any disclaimer, the term of this patent is extended or adjusted under 35 U.S.C. 154(b) by 52 days.

(21) Appl. No.: 14/356,622

(22) PCT Filed: Nov. 22, 2011

(86) PCT No.: PCT/EP2011/005879
§ 371 (c)(1),
(2), (4) Date: May 7, 2014

(87) PCT Pub. No.: WO2013/075727
PCT Pub. Date: May 30, 2013

(65) Prior Publication Data
US 2014/0306770 A1    Oct. 16, 2014

(51) Int. Cl.
H03G 3/20    (2006.01)
H03F 1/02    (2006.01)
H03G 11/04    (2006.01)

(52) U.S. Cl.
CPC .......... *H03F 1/0222* (2013.01); *H03F 1/0227* (2013.01); *H03F 1/0244* (2013.01);
(Continued)

(58) Field of Classification Search
CPC .......... H03F 1/02; H03F 1/0227; H03G 11/04
(Continued)

(56) References Cited

U.S. PATENT DOCUMENTS 3,502,983 A    3/1970 Ingle et al.
4,320,350 A    3/1982 Drapac
(Continued)

OTHER PUBLICATIONS

International Search Report and Written Opinion; Mailed May 14, 2012 for the related PCT Application No. PCT/EP2011/005879.
(Continued)

*Primary Examiner* — Steven J Mottola
*Assistant Examiner* — Hafizur Rahman
(74) *Attorney, Agent, or Firm* — Fogg & Powers LLC (57) ABSTRACT

A signal-processing system has an amplifier that generates an amplified (RF) output signal based on an (RF) input signal. The amplifier receives a supply voltage that can be selectively set to an appropriate level between a lower power supply level and a higher power supply level. With one power supply permanently connected to the supply voltage node, a control unit executes software to toggle a supply switch to periodically connect and disconnect the other power supply thereby generating a weighted average value for the supply voltage between the two power supply levels. When a sudden and large increase occurs in the (input) power level, hardware-interrupt circuitry interrupts and supersedes the software-based control of the supply-voltage switch to quickly switch the supply voltage towards the higher power supply level. The hardware-interrupt circuitry handles such situations faster than the software-based control in order to prevent a limit violation of spectrum emission requirements.

19 Claims, 8 Drawing Sheets

(52) U.S. Cl.
CPC ....... *H03G 11/04* (2013.01); *H03F 2200/105* (2013.01); *H03F 2200/465* (2013.01)

(58) Field of Classification Search
USPC ....... 330/127, 130, 134, 136, 199, 273, 285, 330/296, 297, 144, 284
See application file for complete search history.

(56) References Cited

U.S. PATENT DOCUMENTS

| | | | |
|---|---|---|---|
| 4,348,644 A | 9/1982 | Kamiya | |
| 4,427,951 A | 1/1984 | Amada et al. | |
| 4,442,407 A | 4/1984 | Apel | |
| 4,484,150 A | 11/1984 | Carver | |
| 4,701,717 A * | 10/1987 | Radermacher | H03F 1/30 327/100 |
| 6,028,486 A * | 2/2000 | Andre | H03F 1/0244 330/295 |
| 6,160,449 A | 12/2000 | Klomsdorf et al. | |
| 6,166,598 A | 12/2000 | Schlueter | |
| 6,353,359 B1 | 3/2002 | Leizerovich | |
| 6,507,243 B2 | 1/2003 | Harris et al. | |
| 6,759,902 B2 * | 7/2004 | Kossor | H03G 3/3042 330/136 |
| 6,788,151 B2 | 9/2004 | Shvarts et al. | |
| 7,058,823 B2 | 6/2006 | Lapidus | |
| 7,420,415 B2 * | 9/2008 | Lee | H03G 3/3042 330/136 |
| 7,436,967 B2 * | 10/2008 | Neunaber | H03F 1/52 330/254 |
| 7,443,244 B2 * | 10/2008 | Hagen | H03F 1/0227 330/285 |
| 2007/0024372 A1 | 2/2007 | Hagen | |
| 2007/0291872 A1 * | 12/2007 | Chan | H03F 1/0227 375/297 |
| 2008/0218269 A1 * | 9/2008 | Kirisawa | H03G 3/3042 330/284 |
| 2010/0321116 A1 | 12/2010 | Kim et al. | |
| 2012/0212293 A1 * | 8/2012 | Khlat | H03F 1/0227 330/127 |

OTHER PUBLICATIONS

Tim Fergus, "Improving Amplifier's Efficiency Using a Linearizer in Conjunction with Adaptive Bias Modulation," www.rfdesign.com, Oct. 2005, 5 pages.

* cited by examiner

ADAPTIVE SUPPLY VOLTAGE FOR A POWER AMPLIFIER

BACKGROUND

Field of the Invention

The present invention relates to electronics and, more specifically but not exclusively, to power amplifiers.

Description of the Related Art

This section introduces aspects that may help facilitate a better understanding of the invention. Accordingly, the statements of this section are to be read in this light and are not to be understood as admissions about what is prior art or what is not prior art.

Power amplifiers are used in many applications to amplify electronic signals. For example, power amplifiers are used to amplify electronic signals for broadcast in cellular communications systems, where the electronic signals contain data streams for multiple different users. Depending on the time of day, the electronic signal may contain data streams for different numbers of users. For example, the number of nighttime users may be significantly smaller than the number of daytime users. Typically, the operating power level of such a communications system is proportional to the number of users.

In a typical cellular communications system, a power amplifier may be designed and configured to operate efficiently at maximum traffic levels to provide a gain on the order of 40 dB for an output power of about 10 Watts. Unfortunately, during minimal traffic levels having an output power of 4-5 Watts, that power amplifier will operate less efficiently with higher levels of undesirable DC consumption.

SUMMARY

In one embodiment, a signal-processing system generates an amplified output signal based on an input signal. The system comprises an amplifier, switch circuitry, a software-based control unit, and hardware-interrupt circuitry. The amplifier is configured to generate the amplified output signal, wherein the amplifier is configured to receive a supply voltage. The switch circuitry is configured to generate the supply voltage. The software-based control unit is configured to execute software to control the switch circuitry. The hardware-interrupt circuitry is configured to implement a hardware interrupt to control the switch circuitry.

In one implementation, the hardware-interrupt circuitry implements the hardware interrupt to cause the switch circuitry to increase the supply voltage when the hardware-interrupt circuitry detects a power-level increase in the input signal greater than a specified threshold. One advantage of this implementation is to prevent a limit violation of spectrum emission requirements.

In one implementation, prior to the hardware interrupt, the control unit controlled the switch circuitry to generate the supply voltage. One advantage of this implementation is to control the switch circuitry using software-based control during normal operations.

In one implementation, the software-based control unit comprises a programmable processor. One advantage of this implementation is to provide flexibility to the invention.

In one implementation, the software-based control unit is configured to generate a software-based control signal, and the switch circuitry comprises a supply switch and an interrupt switch. The supply switch is configured to selectively apply a high power supply voltage level to the supply voltage based on a supply-switch control signal. The interrupt switch is configured to selectively set the supply-switch control signal to the software-based control signal, wherein the hardware-interrupt circuitry is configured to control the interrupt switch. One advantage of this implementation is to provide efficient implementation of the switch circuitry.

In one implementation, during non-interrupt operations, the hardware-interrupt circuitry causes the interrupt switch to be closed to connect the software-based control signal to the supply switch via the supply-switch control signal. During interrupt operations, the hardware-interrupt circuitry causes the interrupt switch to be open to (i) disconnect the software-based control signal from the supply switch and (ii) cause the supply switch to be closed in order to connect the high power supply voltage level to the supply voltage. One advantage of this implementation is to provide efficient operations of the hardware-interrupt circuitry.

In one implementation, the hardware-interrupt circuitry comprises a first op amp and a second op amp. The first op amp is configured to generate an op-amp output signal based on a difference between a current measure of input signal power level and a previous measure of the input signal power level. The second op amp is configured to generate an interrupt-switch control signal based on a difference between the op-amp output signal and an interrupt threshold signal, wherein the interrupt-switch control signal is applied to control the interrupt switch. One advantage of this implementation is to provide efficient implementation of the hardware-interrupt circuitry.

In one implementation, the switch circuitry further comprises a diode configured to allow a low power supply voltage level to be permanently connected to the supply voltage and advantageously prevent the high power supply voltage level from being applied to a source of the low power supply voltage level when the supply switch is closed.

In one implementation, the switch circuitry further comprises a low-pass filter configured to generate the supply voltage as a weighted average of the high power supply voltage level and a lower power supply voltage level. One advantage of this implementation is to prevent a noisy supply voltage from being applied to the amplifier.

In one implementation, the signal-processing system further comprises a limiter configured to inhibit increases in the input signal power level from being applied to the amplifier. One advantage of this implementation is to prevent large increases in input signal power level from being suddenly applied to the amplifier.

In one implementation, the limiter comprises a variable attenuator and attenuator control circuitry. The variable attenuator is configured to selectively attenuate the input signal before being applied to the amplifier. The attenuator control circuitry is configured to generate an attenuator control signal to control attenuation level of the variable attenuator. One advantage of this implementation is to provide efficient implementation of the limiter.

In one implementation, the attenuator control circuitry comprises an op amp configured to generate the attenuator control signal based on a difference between a current measure of attenuated input signal power level and a limiter threshold level. One advantage of this implementation is to provide efficient implementation of the attenuator control circuitry.

In one implementation, the attenuation level of the variable attenuator is based on magnitude of the attenuator control signal when the attenuator control signal is positive.

One advantage of this implementation is to provide efficient operation of the variable attenuator.

In one implementation, the software-based control unit is configured to drive the limiter threshold signal towards the current measure of attenuated input signal power level. One advantage of this implementation is to allow the increased input signal power level to be eventually applied to the amplifier.

In another embodiment, the system comprises an amplifier and a limiter. The amplifier is configured to generate the output signal. The limiter is configured to inhibit increases in the input signal power level from being applied to the amplifier.

In one implementation, the limiter comprises a variable attenuator and attenuator control circuitry. The variable attenuator is configured to selectively attenuate the input signal before being applied to the amplifier. The attenuator control circuitry is configured to generate an attenuator control signal to control attenuation level of the variable attenuator. One advantage of this implementation is to provide efficient implementation of the limiter.

In one implementation, the attenuator control circuitry comprises an op amp configured to generate the attenuator control signal based on a difference between a current measure of attenuated input signal power level and a limiter threshold level. One advantage of this implementation is to provide efficient implementation of the attenuator control circuitry.

In one implementation, the attenuation level of the variable attenuator is based on magnitude of the attenuator control signal when the attenuator control signal is positive. One advantage of this implementation is to provide efficient operation of the variable attenuator.

In one implementation, a control unit is configured to drive the limiter threshold signal towards the current measure of attenuated input signal power level. One advantage of this implementation is to allow the increased input signal power level to be eventually applied to the amplifier.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

One way to address at least some of the inefficiencies of operating a power amplifier at different output power levels is to adjust the supply voltage applied to the power amplifier.

Figure 1:
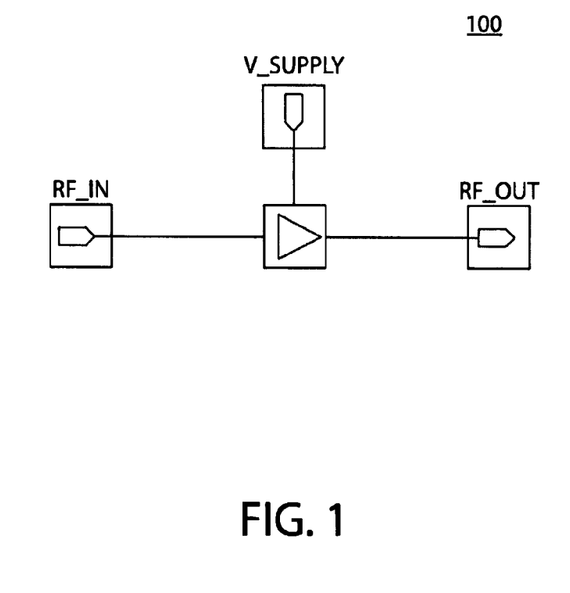
FIG. 1 shows a schematic block diagram of an RF power amplifier configured to receive an RF input signal RF_IN and generate a corresponding, amplified RF output signal RF_OUT.

FIG. 1 shows a schematic block diagram of an RF power amplifier (PA) 100 configured to receive an RF input signal RF_IN and generate a corresponding, amplified RF output signal RF_OUT. As shown in FIG. 1, a supply voltage V_SUPPLY is applied to PA 100 to power the operations of the amplifier. If V_SUPPLY is appropriately adjusted, then the operating efficiency of PA 100 can be improved for different output power levels. In particular, to achieve improved operating efficiency (e.g., lower DC consumption) for a given level of amplifier gain, a relatively high V_SUPPLY level should be applied when the output power level of PA 100 is relatively high, and, similarly, a relatively low V_SUPPLY level should be applied when the output power level of PA 100 is relatively low.

Figure 2:
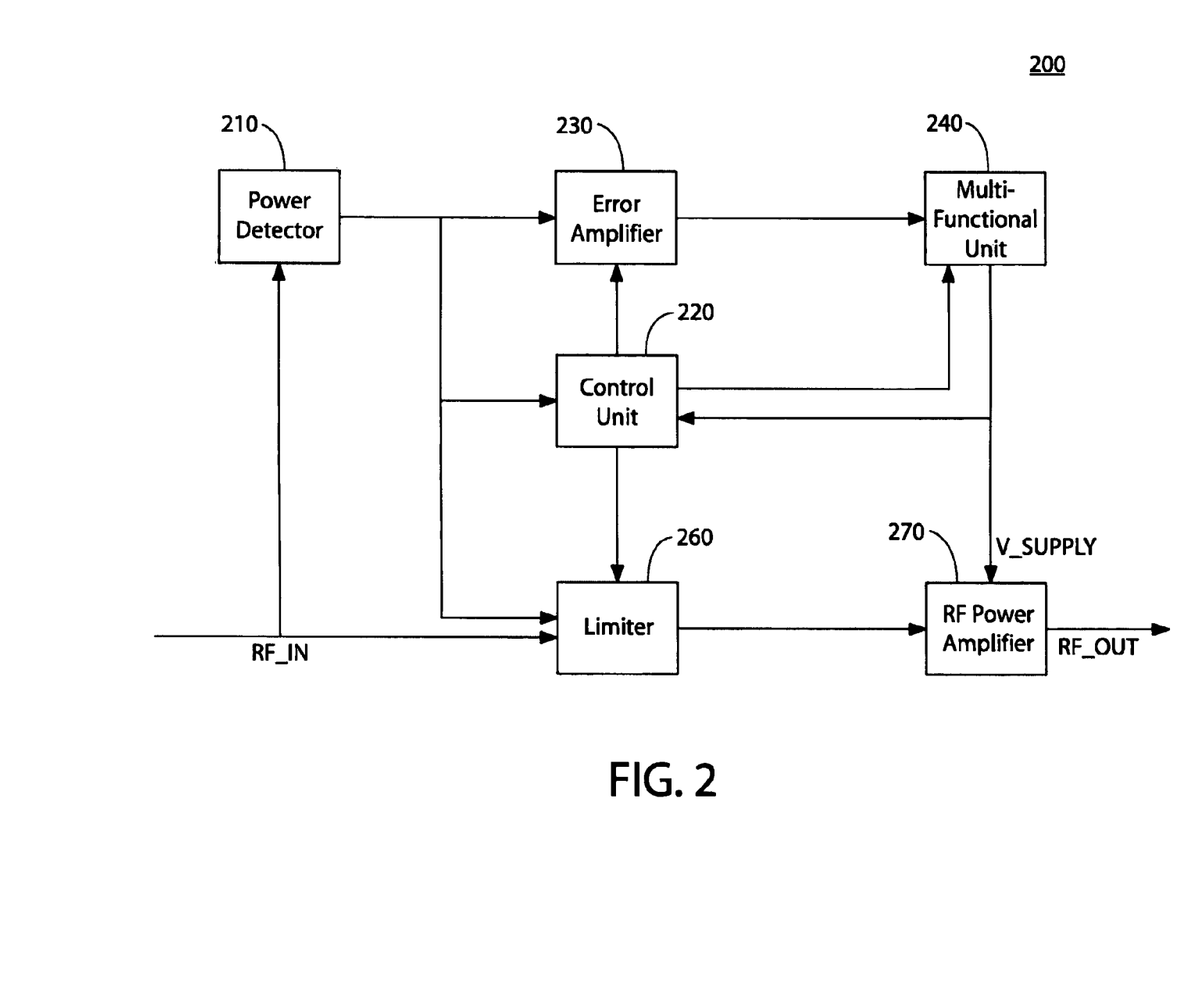
FIG. 2 shows a functional block diagram and FIG. 3 shows a corresponding schematic block diagram of a signal-processing system that can be used to improve the operating efficiency of an RF power amplifier by controlling the voltage level of the supply voltage applied to the amplifier.
Figure 3:
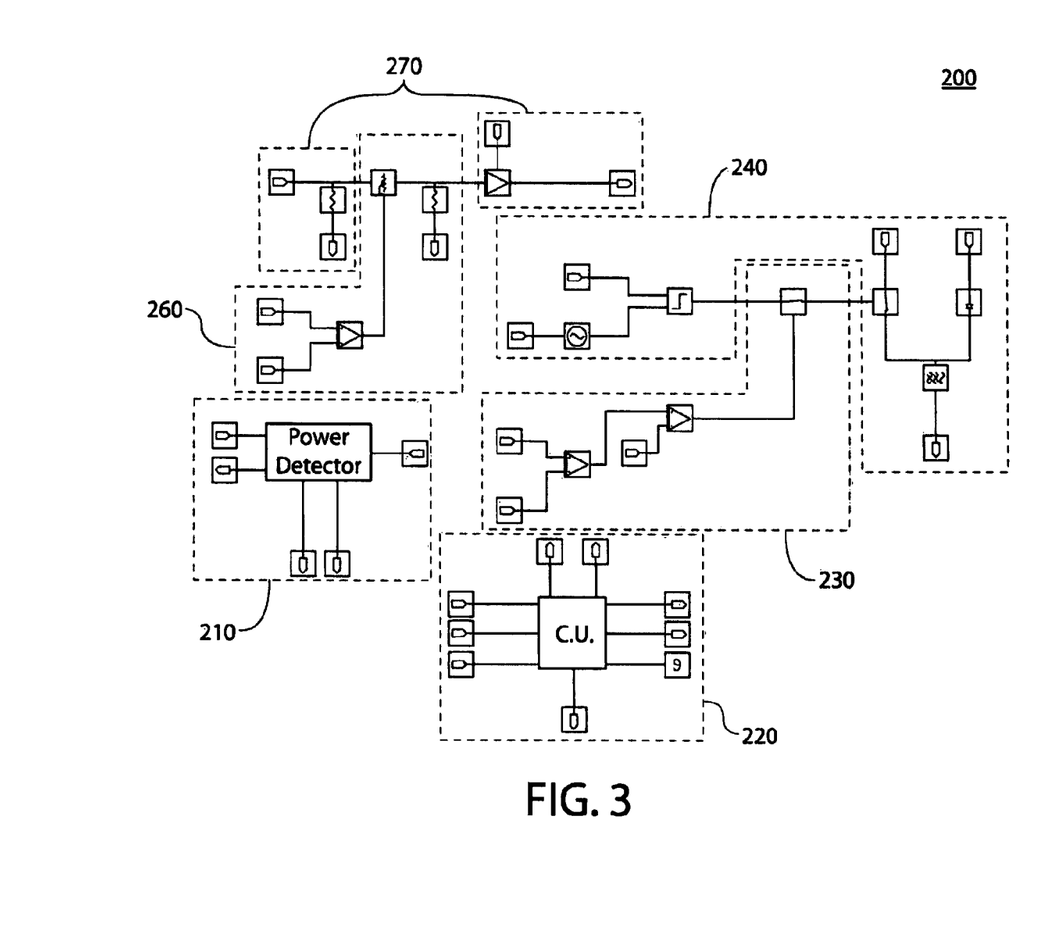

FIG. 2 shows a functional block diagram and FIG. 3 shows a corresponding schematic block diagram of a signal-processing system 200, according to one possible embodiment of the present invention, that can be used to improve the operating efficiency of RF power amplifier 270 by controlling the voltage level of the supply voltage V_SUPPLY applied to the amplifier. As shown in the figures, signal-processing system 200 receives an RF input signal RF_IN and generates a corresponding, amplified RF output signal RF_OUT. In addition to power amplifier 270, signal-processing system 200 includes power detector 210, control unit 220, error amplifier 230, multi-functional unit 240, and limiter 260. FIGS. 4-7 show expanded views of these various components of signal-processing system 200 represented in FIG. 2.

At a high functional level, multi-functional unit (MFU) 240 sets the voltage level for the supply voltage V_SUPPLY applied to RF power amplifier 270. In this embodiment, V_SUPPLY is controlled to have an average voltage level anywhere between 24V and 32V according to the power level of RF input signal RF_IN, where higher input power levels result in higher average supply voltage levels, and vice versa. The voltage level at which MFU 240 sets V_SUPPLY can be determined under either software-based control or hardware-interrupt-based control. Control unit 220 is primarily responsible for the software-based control, while error amplifier 230 is primarily responsible for the hardware-interrupt-based control. In one possible implementation, control unit 220 determines V_SUPPLY using the following formula:

$$V\_SUPPLY(RMS\_OUT\_1) = \begin{cases} 24 & RMS\_OUT\_1 < 2.67094 \\ 456.29 \cdot (RMS\_OUT\_1)^2 - \\ 2387.6 \cdot (RMS\_OUT\_1) + 3146 & 2.67094 \leq RMS\_OUT\_1 \leq 2.75955 \\ 32 & RMS\_OUT\_1 > 2.75955 \end{cases}$$

where RMS_OUT_1 is the current, root mean squared (RMS) power level of RF input signal RF_IN and where V_SUPPLY and RMS_OUT_1 are measured in volts.

Under normal (i.e., non-interrupt) operations, the determination of V_SUPPLY level is controlled by control unit 220 implementing software-based control. In particular, as the RF input power level increases, control unit 220 determines that the V_SUPPLY level should also increase towards 32V, and control unit 220 causes MFU 240 to implement that increase in V_SUPPLY level, and vice versa to implement a decrease in V_SUPPLY level towards 24V.

This software-based control, which is described in further detail below, is highly accurate, but may be too slow to react quickly enough in certain situations. For example, when V_SUPPLY has been previously set to a voltage level significantly below 32V, if there is a sudden and large increase in the power level of the input signal RF_IN, then it is desirable to quickly increase V_SUPPLY to 32V to avoid a limit violation of spectrum emission requirements. In those situations, the hardware-interrupt-based control performed by error amplifier 230 interrupts and supersedes the software-based control by control unit 220 to ensure that V_SUPPLY is quickly increased to 32V.

Note that, when operating with V_SUPPLY at a voltage level significantly above 24V, if the power level of RF_IN suddenly decreases, then there is no analogous need to quickly decrease V_SUPPLY. In that case, the normal software-based control by control unit 220 will eventually control MFU 240 to decrease V_SUPPLY to a suitable relatively low voltage level.

As explained below, the various signals used by control unit 220 and error amplifier 230 to implement their respective software- and hardware-interrupt-based control are generated by power detector 210 as well as by control unit 220 and MFU 240. Limiter 260 prevents excessive power levels in the RF input signal RF_IN from being suddenly applied to RF power amplifier 270 to avoid overdriving the power amplifier.

Power Detector 210

Figure 4:
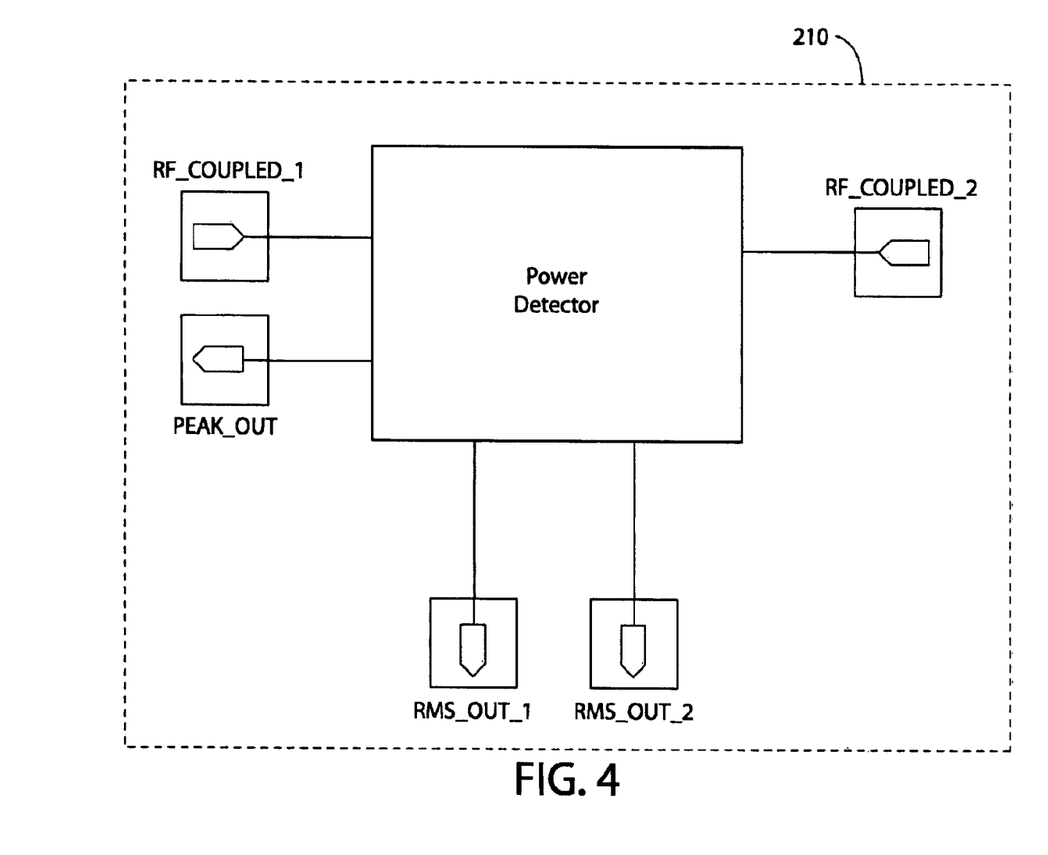
FIG. 4 shows an expanded view of power detector 210 of FIG. 3.
Figure 7:
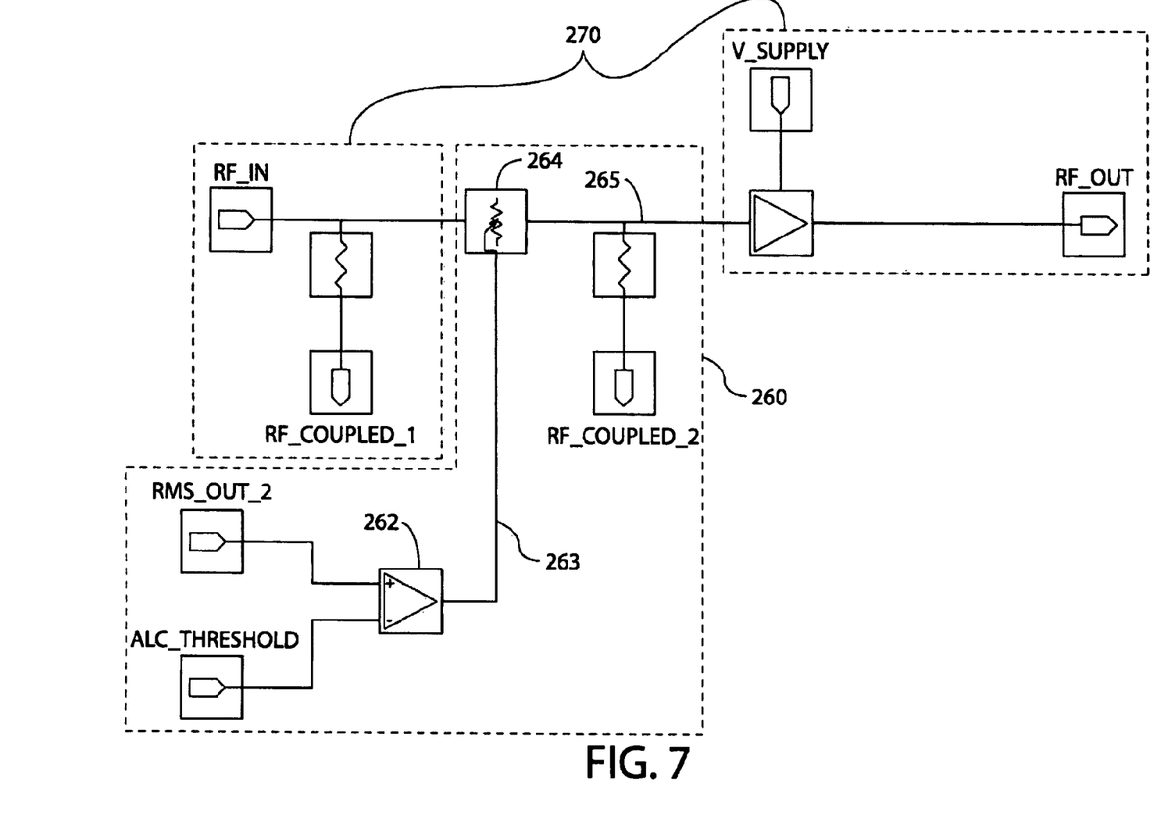
FIG. 7 shows an expanded view of limiter 260 and power amplifier 270 of FIG. 3.

As shown in FIG. 4, power detector 210 receives two RF signals (RF_COUPLED_1 and RF_COUPLED_2) and generates three signals (PEAK_OUT, RMS_OUT_1, and RMS_OUT_2). As shown in FIG. 7, RF_COUPLED_1 is an RF signal tapped from and representative of the RF input signal RF_IN before limiter 260, while RF_COUPLED_2 is an RF signal tapped from and representative of the attenuated RF signal 265 generated by limiter 260 and applied to RF PA 270.

Signal PEAK_OUT is a measure of the recent peak amplitude in RF signal RF_COUPLED_1 over an immediately previous time period of a specified duration. As such, PEAK_OUT is representative of the recent peak amplitude of RF input signal RF_IN.

Signal RMS_OUT_1 is a measure of the current, root mean squared (RMS) power level of RF signal RF_COUPLED_1. As such, RMS_OUT_1 is representative of the current RMS power level of RF input signal RF_IN.

Signal RMS_OUT_2 is a measure of the current, RMS power level of RF signal RF_COUPLED_2. As such, RMS_OUT_2 is representative of the current RMS power level of the attenuated RF signal 265 applied to power amplifier 270.

Control Unit 220

Figure 5:
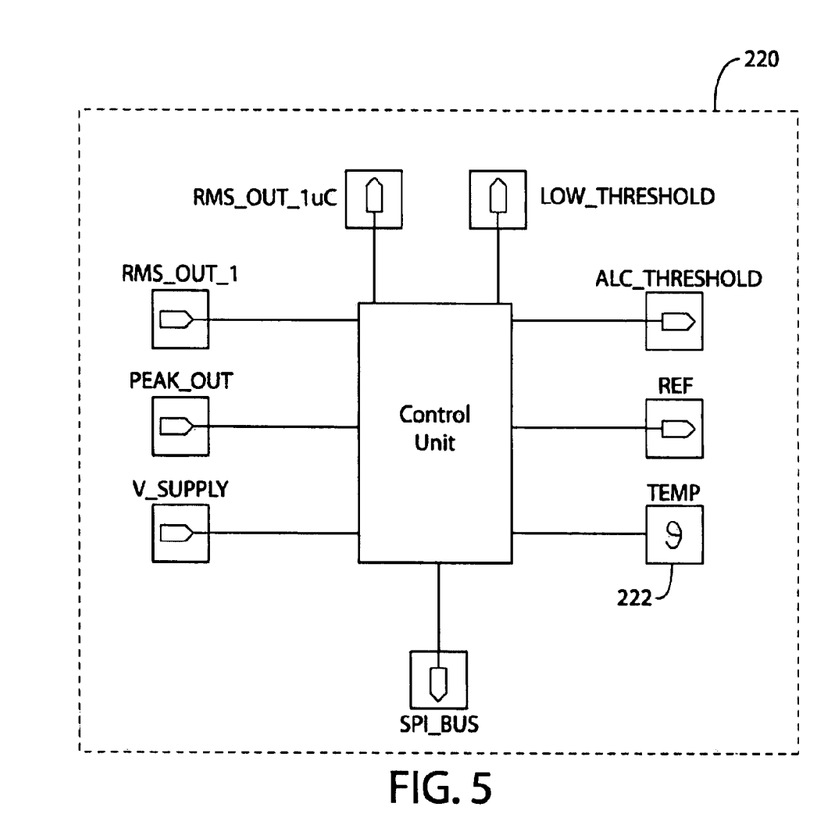
FIG. 5 shows an expanded view of control unit 220 of FIG. 3.

As shown in FIG. 5, control unit 220 receives four signals (RMS_OUT_1, PEAK_OUT, V_SUPPLY, and TEMP) and generates four control signals (RMS_OUT_1$u$C, LOW_THRESHOLD, ALC_THRESHOLD, and REF). In addition, control unit 220 communicates via SPI_BUS (a serial peripheral interface bus) with voltage-controlled oscillator (VCO) 242. The functions of control unit 220 are implemented in software executed by a microcontroller (uC), digital signal processor (DSP), or other suitable programmable processor.

Signals RMS_OUT_1 and PEAK_OUT are received from power detector 210, signal V_SUPPLY is received from multi-functional unit 240, and signal TEMP is received from a local temperature monitor 222, where TEMP indicates the temperature near control unit 220.

The value of signal RMS_OUT_1 received at control unit 220 is presented as the value of the signal RMS_OUT_1$u$C. Because it takes some time for control unit 220 to forward the incoming value of RMS_OUT_1 to become the outgoing value of RMS_OUT_1$u$C, RMS_OUT_1$u$C is effectively a delayed version of RMS_OUT_1, such that, at any given instant of time, the value of RMS_OUT_1$u$C corresponds to a recent, but previous value of RMS_OUT_1. In a typical embodiment, the delay between RMS_OUT_1 and RMS_OUT_1$u$C is in the range of a few milliseconds.

Signal LOW_THRESHOLD is the tolerance window for the hardware interrupt implemented by error amplifier 230. In one possible implementation, LOW_THRESHOLD does not vary with V_SUPPLY and is set once to a fixed value, e.g., 12.3 millivolts. In other possible implementations, control unit 220 generates LOW_THRESHOLD based on the voltage level of V_SUPPLY, using either a lookup table or a mathematical formula, for example, a power series. As described further below in the context of error amplifier 230 of FIG. 6, LOW_THRESHOLD represents a threshold level that defines the permissible difference between RMS_OUT_1_$u$C and RMS_OUT_1. This level indicates that there is no margin between spectrum emission mask and nonlinear carrier emissions with the current supply voltage.

Signal ALC_THRESHOLD is the limiter threshold level. Control unit 220 generates ALC_THRESHOLD based on the current voltage level of V_SUPPLY, using either a lookup table or a mathematical formula, for example, a power series. If a mathematical formula is used, then the voltage level of ALC_THRESHOLD is a function of the supply voltage V_SUPPLY, where higher levels of V_SUPPLY typically imply higher values of ALC_THRESHOLD. In one possible implementation, control unit 220 determines ALC_THRESHOLD using the following formula:

$$\text{ALC\_THRESHOLD}(V\_SUPPLY) = \begin{cases} 0.0087 \cdot (V\_SUPPLY) + 1.6699 & V\_SUPPLY \le 32 \\ 1.9483 & V\_SUPPLY > 32 \end{cases}$$

where V_SUPPLY and ALC_THRESHOLD are measured in volts. As described further below in the context of limiter 260 of FIG. 7, ALC_THRESHOLD represents a threshold level that defines an over-drive limitation for all supply voltage conditions.

Signal REF is the reference voltage applied to MFU 240 for software-based control of supply voltage V_SUPPLY. For every input power level of RF_IN (as indicated to control unit 220 by RMS_OUT_1), there is a desired voltage level for V_SUPPLY, as represented within control unit 220 by a lookup table or a mathematical formula, for example, a power series. If a mathematical formula is used, then the supply voltage level V_SUPPLY is a function of the input power RF_IN, where higher levels of RF_IN typically imply higher levels of V_SUPPLY and lower adapted values of REF. Based on the current value of RMS_OUT_1, control unit 220 adjusts the voltage level of REF by means of closed-loop adaptation to achieve the desired supply voltage level.

Figure 6:
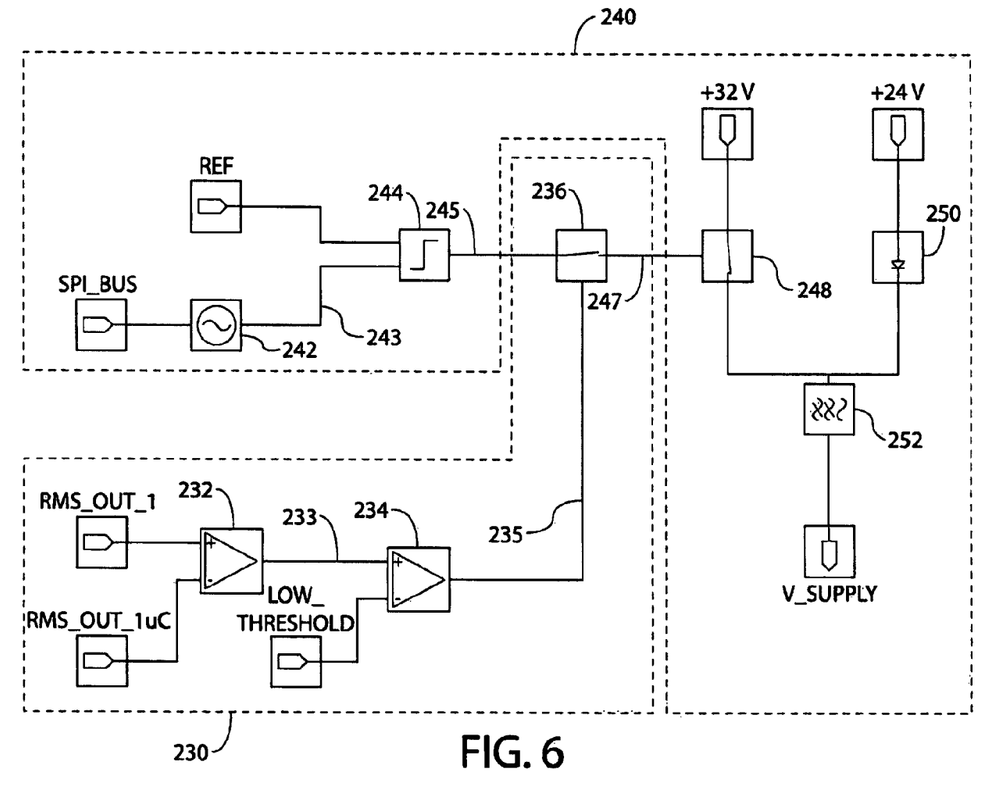
FIG. 6 shows an expanded view of error amplifier 230 and multi-functional unit 240 of FIG. 3.

SPI_BUS is a synchronous, full-duplex, serial peripheral interface (SPI) communication bus that conveys multiple signals generated by control unit 220 to set the frequency, peak amplitude, and offset level of the oscillating output signal 243 generated by voltage-controlled oscillator (VCO) 242 of FIG. 6. Under typical operating conditions, it is desirable for the frequency, peak amplitude, and offset level of VCO output signal 243 to be fixed. Since those characteristics of VCO output signal 243 can vary with the temperature of VCO 242, control unit 220 adjusts the VCO control signals provided via SPI_BUS based on the temperature indicated by the signal TEMP received by control unit 220 from temperature monitor 222 of FIG. 5 to keep the frequency, peak amplitude, and offset level of VCO output signal 243 substantially fixed, using lookup tables or mathematical formulas, such as power series, that relate temperature to those VCO characteristics.

Multi-Functional Unit 240

As shown in FIG. 6, multi-functional unit 240 receives reference voltage REF, the VCO control signals on communication bus SPI_BUS, and two power supply voltage levels (32V and 24V) and generates the supply voltage V_SUPPLY applied to power amplifier 270. The signals on REF and SPI_BUS are received from control unit 220. The source of the two power supply voltages is one or more suitable power supplies (not shown in FIG. 6).

In particular, the VCO control signals on SPI_BUS are applied to set the frequency, peak amplitude, and offset level of VCO output signal 243 generated by VCO 242. Comparator 244 compares reference voltage REF with VCO output signal 243 and generates corresponding software-based control signal 245. As explained below in the context of error amplifier 230 of FIG. 6, under normal (i.e., non-interrupt, software-control) operations, interrupt switch 236 is closed, and software-based control signal 245 is applied as switch-control signal 247 to control the state of supply switch 248.

In particular, when the current amplitude of VCO output signal 243 is greater than the reference voltage REF, comparator 244 generates a low voltage level (i.e., logic 1) for control signal 245, which in turn causes supply switch 248 to be closed. On the other hand, when the current amplitude of VCO output signal 243 is less than the reference voltage REF, comparator 244 generates a high voltage level (i.e., logic 0) for control signal 245, which in turn causes supply switch 248 to be open.

As indicated in FIG. 6, the 24V power supply voltage level is always applied to the V_SUPPLY node through diode 250 and low-pass filter (LPF) 252. As such, when supply switch 248 is open, V_SUPPLY is driven towards 24V. When supply switch 248 is closed, the 32V power supply voltage level is also applied to the node V_SUPPLY via LPF 252. As a result, when supply switch 248 is closed, V_SUPPLY is driven towards 32V. Diode 250 prevents the 32V signal from being applied to (and possibly damaging) the power supply source of the 24V signal. LPF 252 prevents high-frequency noise from being applied to power amplifier 270.

Under typical operating conditions, the level of reference voltage REF is set at some value between the highest amplitude of VCO output signal 243 and the lowest amplitude of VCO output signal 243. As such, for some portion of each periodic oscillation of VCO output signal 243, the current amplitude of VCO output signal 243 will be greater than the reference voltage REF (during which time supply switch 248 will be open and V_SUPPLY will be driven towards 24V), while, during the remaining portion of each oscillation of VCO output signal 243, the current amplitude of VCO output signal 243 will be less than the reference voltage REF (during which time supply switch 248 will be closed and V_SUPPLY will be driven towards 32V). As a result, due to the averaging effect of LPF 252, V_SUPPLY will be at a substantially DC level corresponding to the weighted average of 24V and 32V, where the weighting is based on the relative durations of those two portions of each oscillation of VCO output signal 243.

Control unit 220 can change the DC level of V_SUPPLY by adjusting the level of reference voltage REF. In particular, to increase the DC level of V_SUPPLY, control unit 220 increases the level of REF, and vice versa. Note that, to set V_SUPPLY at 32V, control unit 220 can set REF to be any value at or above the highest amplitude of VCO output signal 243. Similarly, to set V_SUPPLY at 24V, control unit 220 can set REF to be any value at or below the lowest amplitude of VCO output signal 243.

Error Amplifier 230

As shown in FIG. 6, error amplifier 230 receives three signals (RMS_OUT_1, RMS_OUT_1$u$C, and LOW_THRESHOLD) and controls the state of interrupt switch 236. Signal RMS_OUT_1 is received from power detector 210, while signals RMS_OUT_1$u$C and LOW_THRESHOLD are received from control unit 220. Although depicted and described as being part of error amplifier 230, interrupt switch 236 could alternatively be considered to be part of MFU 240.

In particular, operational amplifier (op amp) 232 receives signals RMS_OUT_1 and RMS_OUT_1$u$C and generates an op-amp output signal 233 representative of the voltage difference between RMS_OUT_1 and RMS_OUT_1$u$C, where op-amp output signal 233 is positive when RMS_OUT_1 is greater than RMS_OUT_$u$C.

Op amp 234 receives op-amp output signal 233 and signal LOW_THRESHOLD and generates an interrupt-switch control signal 235 representative of the voltage difference between op-amp output signal 233 and LOW_THRESHOLD, where interrupt-switch control signal 235 is positive when op-amp output signal 233 is greater than LOW_THRESHOLD.

Interrupt-switch control signal 235 controls the state of interrupt switch 236. If interrupt-switch control signal 235 is zero or negative (i.e., logic 1), then interrupt switch 236 is closed, thereby allowing software-based control signal 245 to be applied as supply-switch control signal 247 to control the state of supply switch 248. If interrupt-switch control signal 235 is positive (i.e., logic 0), then interrupt switch 236 is open, thereby preventing software-based control signal 245 from being used to control supply switch 248. Furthermore, when interrupt switch 236 is open, supply-switch control signal 247 is driven low (i.e., logic 1), which causes supply switch 248 to close, thereby driving supply voltage V_SUPPLY towards 32V.

Limiter 260

As shown in FIG. 7, limiter 260 receives two signals (RMS_OUT_2 and ALC_THRESHOLD) and controls the RF attenuation level applied to input signal RF_IN by variable attenuator 264, which may be implemented as a pin diode attenuator. Signal RMS_OUT_2 is received from power detector 210, while signal ALC_THRESHOLD is received from control unit 220.

In particular, op amp 262 integrates over the voltage difference between signals RMS_OUT_2 and ALC_THRESHOLD to generate an attenuation level control (ALC) signal 263, which controls the level of attenuation applied by variable attenuator 264, where higher voltage levels of ALC control signal 263 result in high attenuation levels by variable attenuator 264, and vice versa.

When RMS_OUT_2 is above ALC_THRESHOLD, op amp 262 increases the integrated voltage level of ALC control signal 263, and, when RMS_OUT_2 is below ALC_THRESHOLD, op amp 262 decreases the integrated voltage level of ALC control signal 263. When RMS_OUT_2 is equal to ALC_THRESHOLD, op amp 262 maintains the voltage level of ALC control signal 263 at a stable level.

Note that the output of op amp 262 is never negative. If and when the level of RMS_OUT is sufficiently below ALC_THRESHOLD for a sufficient amount of time, the voltage level of ALC control signal 263 will be driven to zero, but never below zero.

Software Control of Supply Voltage

Figure 8:
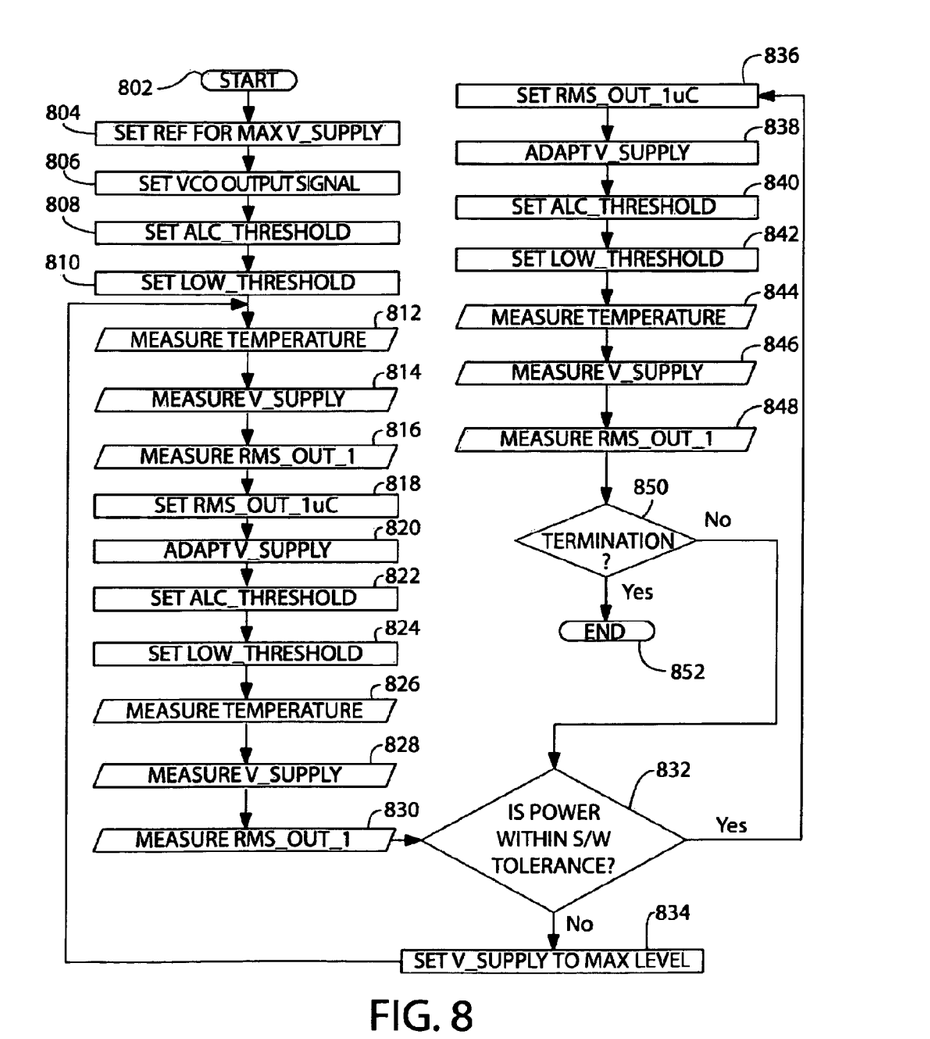
FIG. 8 presents a flow diagram of the processing implemented in software by control unit 220 to control the voltage level of supply voltage V_SUPPLY.

FIG. 8 presents a flow diagram of the processing implemented in software by control unit 220 to control the voltage level of supply voltage V_SUPPLY. Although presented in a particular sequence, some of the steps in FIG. 8 may be performed in a different order or in parallel.

When operations are initiated (at step 802), a signal is applied at the RF input node. In that case, both signals RF_COUPLED_1 and RF_COUPLED_2 are above 0V, which in turn causes power detector 210 to set all of signals PEAK_OUT, RMS_OUT_1, and RMS_OUT_2 to corresponding voltages level above 0V. In addition, the hardware of control unit 220 is designed to initialize ports RMS_OUT_1$u$C, LOW_THRESHOLD, ALC_THRESHOLD, and REF to 0V.

With ALC_THRESHOLD initialized low and RMS_OUT_2 high, limiter 260 will drive variable attenuator 264 to its maximum attenuation.

With LOW_THRESHOLD set, RMS_OUT_1$u$C initialized low, and RMS_OUT_1 initialized high, error amplifier 230 will generate interrupt-switch control signal 235 at a positive level (i.e., logic 0), which will cause interrupt switch 236 to be open. Opening interrupt switch 236 causes supply-switch control signal 247 to be driven low (logic 1), which will close supply switch 248 and, as a result, drive supply voltage V_SUPPLY towards 32V.

At step 804, control unit 220 sets reference voltage REF to its minimum value corresponding to the maximum V_SUPPLY voltage level of 32V.

At step 806, control unit 220 generates communication bus SPI_BUS to control VCO 242 to generate the desired frequency, peak amplitude, and offset level of VCO output signal 243. As a result, initializing REF to its minimum value causes comparator 244 to generate a low level for software-based control signal 245.

At step 808, control unit 220 sets ALC_THRESHOLD to its maximum value corresponding to the maximum V_SUPPLY voltage level of 32V. Setting ALC_THRESHOLD to its maximum value causes limiter 260 to drive variable attenuator 264 towards a zero attenuation level.

At step 810, control unit 220 sets LOW_THRESHOLD to a value corresponding to the maximum V_SUPPLY voltage level of 32V. With RMS_OUT_1$u$C initialized low, setting LOW_THRESHOLD causes error amplifier 230 to drive interrupt-switch control signal 235 high (logic 0), which will keep interrupt switch 236 open, thereby keeping switch-control signal 247 low (logic 1), thereby keeping supply switch 248 closed and V_SUPPLY at 32V.

At step 812, control unit 220 measures the temperature signal TEMP received from temperature monitor 222. This temperature measure indicates the local temperature.

At step 814, control unit 220 measures the voltage level of supply voltage V_SUPPLY received from MFU 240.

At step 816, control unit 220 measures the level of signal RMS_OUT_1 received from power detector 210. This RMS voltage measure indicates the current power level of input signal RF_IN.

At step 818, control unit 220 sets the level of input power signal RMS_OUT_1$u$C to be equal to RMS_OUT_1. With the LOW_THRESHOLD value set in step 810, setting RMS_OUT_1$u$C to RMS_OUT_1 causes error amplifier 230 to generate a negative (logic 1) level for interrupt-switch control signal 235, which will close interrupt switch 236, thereby allowing the currently low (logic 1) value of software-based control signal 245 to be applied to supply switch 248 as switch-control signal 247, thereby keeping supply switch 248 closed and V_SUPPLY at 32V.

At step 820, if control unit 220 determines that the conditions are appropriate, control unit 220 increments reference voltage REF to cause supply voltage V_SUPPLY to be set to a lower supply voltage (e.g., 31.8V). The conditions will be appropriate if the input power level, as indicated by RMS_OUT_1, is sufficiently low to justify decreasing V_SUPPLY.

At step 822, control unit 220 updates the level of the limiter threshold ALC_THRESHOLD for the new level of V_SUPPLY. In particular, control unit 220 decreases ALC_THRESHOLD as V_SUPPLY decreases.

At step 824, if appropriate, control unit 220 updates the level of the hardware-interrupt threshold LOW_THRESHOLD for the new level of V_SUPPLY.

At step 826, control unit 220 again measures the temperature signal TEMP received from temperature monitor 222.

At step 828, control unit 220 again measures the voltage level of supply voltage V_SUPPLY received from MFU 240. This voltage measure indicates the adapted voltage level of V_SUPPLY. At step 830, control unit 220 again measures the level of signal RMS_OUT_1 received from power detector 210. This RMS voltage measure indicates the current power level of input signal RF_IN.

At step 832, control unit 220 determines if the average power lies inside the software tolerance window (e.g., if a running average power value based on RMS_OUT_1_$u$C is less than a specified power value corresponding a V_SUPPLY level of 32V). If the average power lies inside the tolerance window, then the RF power can be handled by software-based incremental or decremental adjustment of supply voltage V_SUPPLY. However, if the average power does not lie within the tolerance window, then the amplifier should be operated at relatively high power, and the supply voltage V_SUPPLY should be increased to the 32V level. If control unit 220 determines at step 832 that the average power does lie inside the tolerance window, then processing continues to step 836. Otherwise, if control unit 220 determines at step 832 that the average power does not lie inside the tolerance window, then processing continues to step 834.

At step 834, control unit 220 causes supply voltage V_SUPPLY to be increased to the 32V level. In particular, control unit 220 lowers signal REF that software-based control signal 245 changes from having a toggling voltage level to having a fixed low voltage level (i.e., logic 1), which keeps supply switch 248 closed. After step 834, the process returns to step 812.

Steps 836-848 are substantially identical to steps 818-830, respectively.

At step 850, control unit 220 determines whether to terminate processing. If so, then processing terminates at step 852. If not, then processing returns to step 832. Processing is terminated, for example, when power amplifier 270 is no longer needed to amplify RF input signal RF_IN.

Hardware Control of Supply Voltage

During normal operations of signal-processing system 200, the current RMS power level of RF input signal RF_IN changes relatively slowly such that the voltage level of the supply voltage V_SUPPLY can be driven to an appropriate value greater than or equal to 24V and less than or equal to 32V under the relatively slow, but accurate software-based control of control unit 220. As the RF input power level slowly varies up or down, control unit 220 can implement the software-based control to adjust the supply voltage level up or down between 24V and 32V as appropriate.

There are situations, however, when the power level of RF input signal RF_IN increases too quickly and by too much for the software-based processing of control unit 220 to react fast enough to quickly increase the voltage level of supply voltage V_SUPPLY. In those situations, signal-processing system 200 is designed with a hardware interrupt to interrupt and supersede the normal software-based processing.

Referring again to FIG. 6 and as described above in the context of FIG. 8, for normal operations, the software-based processing of control unit 220 causes supply switch 248 to be open and closed for different, but relatively fixed portions of each oscillation of VCO output signal 243, thereby setting supply voltage V_SUPPLY to a relatively static, weighted average value between 24V and 32V. During such operations, the current power level of input signal RF_IN (as indicated by RMS_OUT_1) may be slightly above or below but always relatively close to a recent power level of input signal RF_IN (as indicated by RMS_OUT_1$u$C). In that case, the sign of op-amp output signal 233 may be positive or negative, but the magnitude of op-amp output signal 233 will be relatively small. In particular, op-amp output signal 233 will be less than the hardware-interrupt threshold LOW_THRESHOLD. In that case, interrupt-switch control signal 235 will be negative (logic 1) and, as a result, interrupt switch 236 will be closed, allowing control unit 220 to control the state of supply switch 248 via software-based control signal 245.

During such normal operations, if the current power level of RF_IN suddenly increases by a sufficiently large amount, then the current RMS signal RMS_OUT_1 will be significantly greater than the recent RMS signal RMS_OUT_1$u$C, and op-amp output signal 233 will be quickly driven greater than the threshold LOW_THRESHOLD, which will quickly drive interrupt-switch control signal 235 high (logic 0), which will in turn quickly open interrupt switch 236. Opening interrupt switch 236 causes supply-switch control signal 247 to be quickly driven low (logic 1), which will quickly close supply switch 248 and, as a result, quickly increase supply voltage V_SUPPLY towards 32V.

In a typical implementation, the reaction time of the software-based control of V_SUPPLY is on the order of about 10 milliseconds, while the reaction time of the hardware-interrupt-based control of V_SUPPLY is on the order of about 10 microseconds or less.

Limiter Operations

Referring again to FIG. 7, limiter 260 limits the magnitude of increases in the power level applied to the input node of power amplifier 270. In particular, based on its current level of RF attenuation, variable attenuator 264 attenuates the RF power level of input signal RF_IN to generate attenuated RF signal 265, which is applied to the input node of power amplifier 270. By means of closed-loop adaptation, op amp 262 controls the RF attenuation level of variable attenuator 264 such that RMS_OUT_2 is driven to the value of ALC_THRESHOLD, where RMS_OUT_2 represents the RMS voltage level of attenuated RF signal 265 generated by power detector 210 based on the current voltage signal RF_COUPLED_2. Control unit 220 adjusts the value of ALC_THRESHOLD as a function of the supply voltage level V_SUPPLY, where ALC_THRESHOLD is increased as V_SUPPLY increases, and vice versa.

Under normal operating conditions during which the value of RMS_OUT_2 is less than or equal to ALC_THRESHOLD, op amp 262 will generate ALC control signal 263 to have a value of zero, which in turn will cause variable attenuator 264 to apply no RF attenuation to the input signal RF_IN, such that the attenuated RF signal 265 will be substantially equal to the RF input signal.

When the RF power level of input signal RF_IN increases such that the value of RMS_OUT_2 is above ALC_THRESHOLD, op amp 262 will generate a positive voltage level for ALC control signal 263, which in turn will result in a non-zero level of attenuation by variable attenuator 264. Op amp 262 acts as an integrator, whose output voltage is ALC control signal 263. As long as RMS_OUT_2 is above ALC_THRESHOLD, then the voltage level of ALC control signal 263 will continue to rise, which will result in the attenuation level of variable attenuator 264 to continue to rise.

As the attenuation level of variable attenuator 264 continues to rise, the voltage level of attenuated RF signal 265, as indicated by RF_COUPLED_2, will continue to decrease, which causes the value of RMS_OUT_2 to decrease towards ALC_THRESHOLD, which in turn causes the voltage level of ALC control signal 263 to rise more slowly. When RMS_OUT_2 reaches ALC_THRESHOLD, ALC control signal 263 will become stable, which will result in the attenuation level of variable attenuator 264 to become stable, resulting in RF_COUPLED_2 and RMS_OUT_2 also becoming stable (assuming a stable RF input power level).

In this way, limiter 260 prevents sudden and significant increases in RF power level from being applied to amplifier 270.

At the same time, control unit 220 reacts (relatively slowly) to the original increase in the RF input power level (as indicated by RF_COUPLED_1 and RMS_OUT_1) by raising the voltage level of V_SUPPLY and therefore the level of ALC_THRESHOLD. Raising the level of ALC_THRESHOLD above RMS_OUT_2 results in the integration operations of op amp 262 to decrease the voltage level of ALC control signal 263, which in turn begins to decrease the attenuation level of variable attenuator 264, which results in increasing values of RF_COUPLED_2 and RMS_OUT_2. In this way, RMS_OUT_2 will track the increase in ALC_THRESHOLD, thereby allowing more of the RF input power to reach amplifier 270.

Note that, when the RF input power level decreases, suddenly or otherwise, such that RMS_OUT_2 is below ALC_THRESHOLD, op amp 262 will drive ALC control signal 263 to zero, which will result in the attenuation level of variable attenuator 264 also being at zero. As a result of the decrease in RF input power level, control unit 220 may eventually decrease V_SUPPLY and therefore ALC_THRESHOLD. If, after being decreased, the level of ALC_THRESHOLD falls below RMS_OUT_2, then op amp 262 will drive RMS_OUT_2 down towards ALC_THRESHOLD in the same manner as described above.

Although the present invention has been described in the context of an amplifier system for RF signals, the invention can also be implemented in the context of amplifier systems for any suitable signals other than RF signals, including signals having frequencies above or below RF frequencies.

The present invention may be implemented in the context of any suitable type of amplifier, such as power amplifiers in classes A, AB, B, and C.

Although the present invention has been described in the context of an embodiment that sets V_SUPPLY to voltage levels between 24V and 32V, the present invention can also be implemented in other contexts. For example, the two voltage levels may be other than 24V and/or 32V.

Although the present invention has been described in the context of a system in which the lower power supply (24V) is permanently connected to V_SUPPLY and the higher power supply (32V) is switchably connected to V_SUPPLY, in alternative embodiments, the lower power supply may be the switched power supply instead of (or in addition to) the higher power supply.

Although the present invention has been described in the context of a system that generates a particular set of signals, such as PEAK_OUT, RMS_OUT_1, RMS_OUT_1$u$C, and RMS_OUT_2, the present invention can be implemented using a different set of suitable signals. For example, although the present invention has been described in the context of an embodiment that monitors the RF input signal RF_IN to determine the voltage level for V_SUPPLY, the present invention can also be implemented in the context of embodiments that instead monitor the RF output signal RF_OUT to make that determination.

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, general-purpose computer, or other programmable processor.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A signal-processing system for generating an amplified output signal based on an input signal, the system comprising:
an amplifier configured to generate the amplified output signal, wherein the amplifier is configured to receive a supply voltage;
switch circuitry configured to generate the supply voltage;

a software-based control unit configured to execute software to control the switch circuitry; and hardware-interrupt circuitry configured to implement a hardware interrupt to control the switch circuitry, wherein the software-based control unit and the hardware interrupt circuitry are connected to the switch circuitry in parallel such that the switch circuitry is controllable (i) by the software-based control unit independent of the hardware-interrupt circuitry and (ii) by the hardware interrupt circuitry independent of the software-based control unit.

2. The invention of claim 1, wherein the hardware-interrupt circuitry implements the hardware interrupt to cause the switch circuitry to increase the supply voltage when the hardware interrupt circuitry detects a power-level increase in the input signal greater than a specified threshold.

3. The invention of claim 2, wherein, prior to the hardware interrupt, the control unit controlled the switch circuitry to generate the supply voltage.

4. The invention of claim 1, wherein the software-based control unit comprises a programmable processor.

5. The invention of claim 1, wherein: the software-based control unit is configured to generate a software-based control signal; and the switch circuitry comprises:

a supply switch configured to selectively apply a high power supply voltage level to the supply voltage based on a supply-switch control signal;

an interrupt switch configured to selectively set the supply-switch control signal to the software-based control signal, wherein the hardware-interrupt circuitry is configured to control the interrupt switch.

6. The invention of claim 5, wherein:

during non-interrupt operations, the hardware-interrupt circuitry causes the interrupt switch to be closed to connect the software-based control signal to the supply switch via the supply-switch control signal; and during interrupt operations, the hardware-interrupt circuitry causes the interrupt switch to be open to (i) disconnect the software-based control signal from the supply switch and (ii) cause the supply switch to be closed in order to connect the high power supply voltage level to the supply voltage.

7. The invention of claim 5, wherein the hardware-interrupt circuitry comprises:

a first op amp configured to generate an op-amp output signal based on a difference between a current measure of input signal power level and a previous measure of the input signal power level; and a second op amp configured to generate an interrupt-switch control signal based on a difference between the op-amp output signal and an interrupt threshold signal, wherein the interrupt-switch control signal is applied to control the interrupt switch.

8. The invention of claim 5, wherein the switch circuitry further comprises a diode configured to allow a low power supply voltage level to be permanently connected to the supply voltage and prevent the high power supply voltage level from being applied to a source of the low power supply voltage level when the supply switch is closed.

9. The invention of claim 8, wherein the switch circuitry further comprises a low-pass filter configured to generate the supply voltage as a weighted average of the high power supply voltage level and a lower power supply voltage level.

10. The invention of claim 1, further comprising a limiter configured to inhibit increases in the input signal power level from being applied to the amplifier.

11. The invention of claim 10, wherein the limiter comprises:

a variable attenuator configured to selectively attenuate the input signal before being applied to the amplifier;

attenuator control circuitry configured to generate an attenuator control signal to control attenuation level of the variable attenuator.

12. The invention of claim 11, wherein the attenuator control circuitry comprises an op amp configured to generate the attenuator control signal based on a difference between a current measure of attenuated input signal power level and a limiter threshold level.

13. The invention of claim 12, wherein the attenuation level of the variable attenuator is based on magnitude of the attenuator control signal when the attenuator control signal is positive.

14. The invention of claim 12, wherein the software-based control unit is configured to drive the limiter threshold signal towards the current measure of attenuated input signal power level.

15. A signal-processing system for generating an amplified output signal based on an input signal, the system comprising:

an amplifier configured to generate the amplified output signal, wherein the amplifier is configured to receive a supply voltage;

switch circuitry configured to generate the supply voltage;

a software-based control unit configured to execute software to control the switch circuitry; and hardware-interrupt circuitry configured to implement a hardware interrupt to control the switch circuitry, wherein:

the software-based control unit is configured to generate a software-based control signal; and the switch circuitry comprises:

a supply switch configured to selectively apply a high power supply voltage level to the supply voltage based on a supply-switch control signal; and an interrupt switch configured to selectively set the supply-switch control signal to the software-based control signal, wherein the hardware-interrupt circuitry is configured to control the interrupt switch.

16. The invention of claim 15, wherein:

during non-interrupt operations, the hardware-interrupt circuitry causes the interrupt switch to be closed to connect the software-based control signal to the supply switch via the supply-switch control signal; and during interrupt operations, the hardware-interrupt circuitry causes the interrupt switch to be open to (i) disconnect the software-based control signal from the supply switch and (ii) cause the supply switch to be closed in order to connect the high power supply voltage level to the supply voltage.

17. The invention of claim 15, wherein the hardware-interrupt circuitry comprises:

a first op amp configured to generate an op-amp output signal based on a difference between a current measure of input signal power level and a previous measure of the input signal power level; and a second op amp configured to generate an interrupt-switch control signal based on a difference between the op-amp output signal and an interrupt threshold signal, wherein the interrupt-switch control signal is applied to control the interrupt switch.

18. The invention of claim 15, wherein the switch circuitry further comprises a diode configured to allow a low power supply voltage level to be permanently connected to the supply voltage and prevent the high power supply voltage level from being applied to a source of the low power supply voltage level when the supply switch is closed.

19. The invention of claim 18, wherein the switch circuitry further comprises a lowpass filter configured to generate the supply voltage as a weighted average of the high power supply voltage level and a lower power supply voltage level.

* * * * *